United States Patent
Arai (10) Patent No.: US 11,398,564 B2
(45) Date of Patent: Jul. 26, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Masatoshi Arai, Hakusan Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/198,050

(22) Filed: Mar. 10, 2021

(65) Prior Publication Data

US 2022/0085191 A1 Mar. 17, 2022

(30) Foreign Application Priority Data

Sep. 11, 2020 (JP) .............................. JP2020-153274

(51) Int. Cl.
*H01L 29/739* (2006.01)
*H01L 23/495* (2006.01)
*H01L 29/78* (2006.01)

(52) U.S. Cl.
CPC .... *H01L 29/7397* (2013.01); *H01L 23/49562* (2013.01); *H01L 29/7813* (2013.01)

(58) Field of Classification Search
CPC ............. H01L 29/7397; H01L 29/7813; H01L 23/49562
USPC ........................................................ 257/331
See application file for complete search history.

(56) References Cited

U.S. PATENT DOCUMENTS

| 10,236,372 B2 | 3/2019 | Okumura et al. |
| 2008/0265386 A1* | 10/2008 | Muto ...................... H01L 24/40 257/676 |
| 2009/0152697 A1* | 6/2009 | Tamimoto ............... H01L 24/48 257/676 |
| 2009/0189264 A1* | 7/2009 | Yato .................. H01L 23/49513 257/676 |

(Continued)

FOREIGN PATENT DOCUMENTS

| JP | 2018-019045 A | 2/2018 |
| JP | 2019-160901 A | 9/2019 |
| JP | 2020-013923 A | 1/2020 |

*Primary Examiner* — Igwe U Anya
(74) *Attorney, Agent, or Firm* — Kim & Stewart LLP (57) ABSTRACT

According to one embodiment, a semiconductor device includes first and second metal members, and a semiconductor element. The first metal member is electrically connected to a first terminal. The semiconductor element includes first and second electrodes, first to third semiconductor regions, and a gate electrode. The second metal member is provided on the second electrode, and electrically connected to the second electrode and a second terminal. The semiconductor element includes a first portion that overlaps the second metal member in the first direction, and a second portion that does not overlap the second metal member in the first direction. A length in the second direction of the first semiconductor region between an adjacent pair of the gate electrodes is greater than a length in the second direction of the first semiconductor region between an adjacent pair of the gate electrodes.

8 Claims, 9 Drawing Sheets

(56) References Cited

U.S. PATENT DOCUMENTS

2017/0194294 A1* 7/2017 Yanagida ............ H01L 27/0207
2019/0103479 A1* 4/2019 Suzuki .................. H01L 29/36

* cited by examiner

SEMICONDUCTOR DEVICE

CROSS-REFERENCE TO RELATED APPLICATIONS

This application is based upon and claims the benefit of priority from Japanese Patent Application No. 2020-153274, filed on Sep. 11, 2020; the entire contents of which are incorporated herein by reference.

FIELD

Embodiments described herein relate generally to a semiconductor device.

BACKGROUND

A semiconductor device, such as a metal-oxide-semiconductor field-effect transistor (MOSFET) or an insulated gate bipolar transistor (IGBT) is used in electric power conversion and the like. Semiconductor devices are preferably resistant to failure.

DETAILED DESCRIPTION

According to one embodiment, a semiconductor device includes a first metal member, a semiconductor element, and a second metal member. The first metal member is electrically connected to a first terminal. The semiconductor element includes a first electrode, a first semiconductor region of a first conductivity type, a second semiconductor region of a second conductivity type, a third semiconductor region of the first conductivity type, a gate electrode, and a second electrode. The first electrode is provided on the first metal member and electrically connected to the first metal member. The first semiconductor region is provided on the first electrode. The second semiconductor region is provided on the first semiconductor region. The third semiconductor region is provided on the second semiconductor region. The gate electrode faces a portion of the first semiconductor region, the second semiconductor region, and the third semiconductor region via a gate insulating layer in a second direction perpendicular to a first direction. The first direction is from the first metal member toward the first electrode. The second electrode is provided on the second semiconductor region and the third semiconductor region, and electrically connected to the second semiconductor region and the third semiconductor region. A plurality of the second semiconductor regions, a plurality of the third semiconductor regions, and a plurality of the gate electrodes are provided in the second direction in the semiconductor element. The second metal member is provided on the second electrode. The second metal member is electrically connected to the second electrode and electrically connected to a second terminal. The semiconductor element includes a first portion where the second electrode is provided that overlaps the second metal member in the first direction, and a second portion where the second electrode is provided that does not overlap the second metal member in the first direction. A length in the second direction of the first semiconductor region between an adjacent pair of the gate electrodes in the second portion is greater than a length in the second direction of the first semiconductor region between an adjacent pair of the gate electrodes in the first portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$ and $p^+$, p represent relative high and low concentration of impurities. That is, the notation with "+" shows that the impurity concentration is relatively higher than the concentration of the notation without any of "+" and "−", and the notation with "−" shows that the impurity concentration is relatively lower than the concentration of the notation without any of them. These notations represent relative high and low concentration of net impurities after compensation of the impurities, when both of p-type impurity and n-type impurity are included in respective regions.

In the embodiments described later, the embodiments may be executed by inverting the p-type and the n-type in respective semiconductor regions.

First Embodiment

Figure 1:
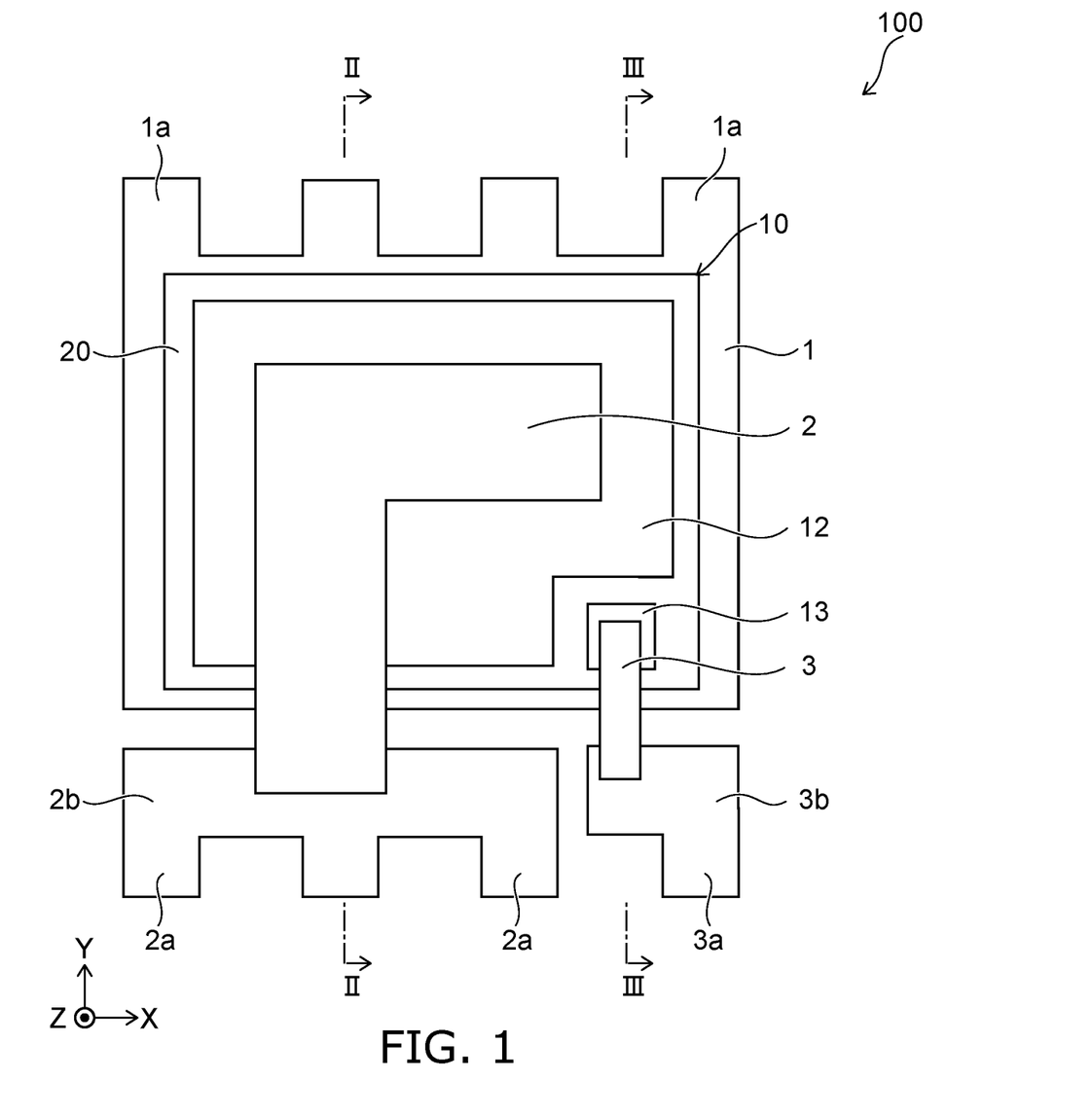
FIG. 1 is a plan view illustrating a semiconductor device according to a first embodiment.

FIG. 1 is a plan view illustrating a semiconductor device according to a first embodiment.

Figure 2:
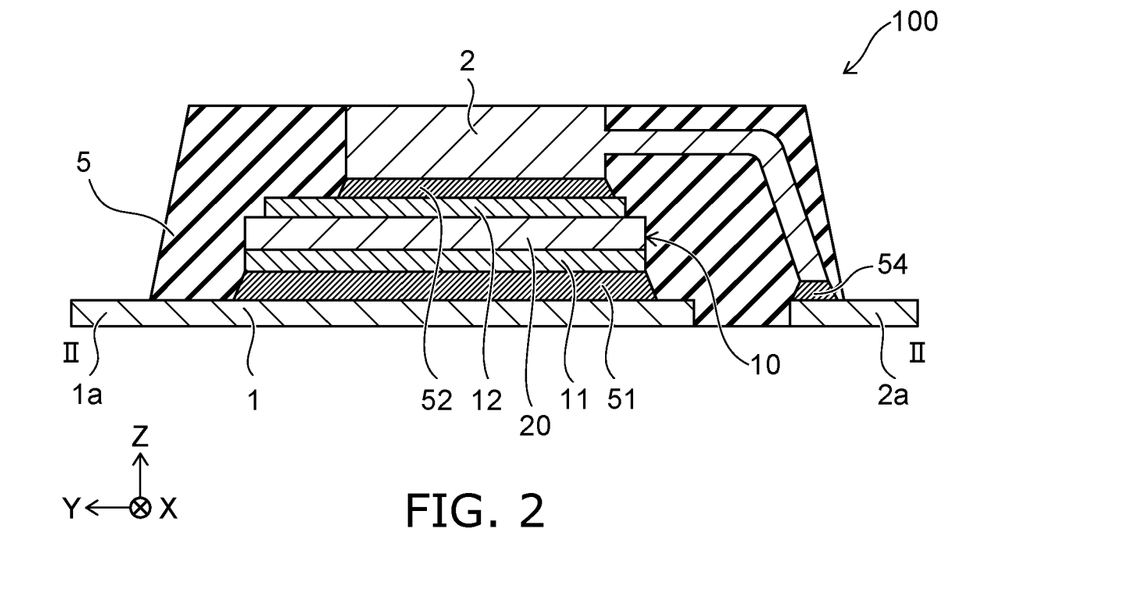
FIG. 2 is a cross-sectional view taken along II-II of FIG. 1.
Figure 3:
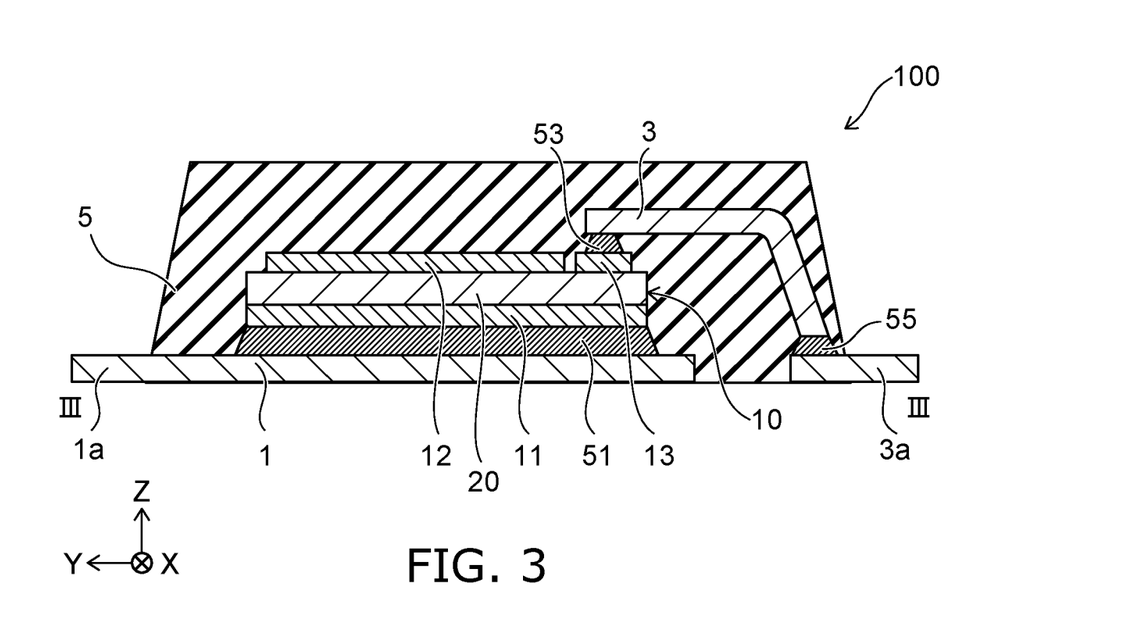
FIG. 3 is a cross-sectional view taken along of FIG.

FIG. 2 is a cross-sectional view taken along II-II of FIG. 1. FIG. 3 is a cross-sectional view taken along of FIG. 1.

As illustrated in FIGS. 1 to 3, a semiconductor device 100 includes a first metal member 1, a second metal member 2, a third metal member 3, a sealing portion 5, and a semiconductor element 10. In FIG. 1, the sealing portion 5 is omitted.

As illustrated in FIGS. 2 and 3, the semiconductor element 10 includes a first electrode 11, a second electrode 12, a third electrode 13, and a semiconductor layer 20.

The embodiments will be described using an XYZ orthogonal coordinate system. The direction from the first metal member 1 toward the first electrode 11 is defined as the Z-direction (first direction). The two directions perpendicular to the Z-direction and orthogonal to one another are defined as the X-direction (second direction) and the Y-direction (third direction). Also, in the description, the direction from the first metal member 1 toward the first electrode 11 is referred to as "up", and the opposite direction is referred to as "down". These directions are based on the relative positional relationship between the first metal member 1 and the first electrode 11 and have no connection to the direction of gravity.

The first metal member 1 is provided at the lower surface of the semiconductor device 100. The first metal member 1 is electrically connected to a first terminal 1a. For example, the first terminal 1a is integrally formed with the first metal member 1. The first metal member 1 and the first terminal 1a may be formed of separate members. For example, as illustrated in FIG. 1, a plurality of the first terminals 1a may be provided in the X-direction, with each first terminal 1a extending in the Y-direction.

The semiconductor element 10 is, for example, a MOSFET. The first electrode 11 is provided on the first metal member 1 and is electrically connected to the first metal member 1. The semiconductor layer 20 is provided on the first electrode 11. The second electrode 12 and the third electrode 13 are provided on the semiconductor layer 20. The third electrode 13 is provided separated from the second electrode 12 and is electrically separated from the second electrode 12.

The second metal member 2 is provided on the second electrode 12 and is electrically connected to the second electrode 12. The second metal member 2 is electrically connected to a second terminal 2a. For example, as illustrated in FIG. 1, a plurality of the second terminals 2a may be provided in the X-direction, with each second terminal 2a extending in the Y-direction.

The third metal member 3 is provided on the third electrode 13 and electrically connected to the third electrode 13. The third metal member 3 is electrically connected to a third terminal 3a.

In the example of FIGS. 2 and 3, the first electrode 11 to third electrode 13 are electrically connected to the first metal member 1 to the third metal member 3 via join portion 51 to join portion 53, respectively. The second metal member 2 and the third metal member 3 are electrically connected to the second terminal 2a and the third terminal 3a via join portions 54 and 55, respectively. However, the invention is not limited to this example, and two members may be in contact without a connection portion. The second metal member 2 may be integrally formed with the second terminal 2a. The third metal member 3 may be integrally formed with the third terminal 3a.

The shapes of the first metal member 1, the second metal member 2, and the third metal member 3 are not limited to that illustrated in the example and may be changed as appropriate depending on the application of the semiconductor device 100. Also, the number and shape of the first terminal 1a, the second terminal 2a, and the third terminal 3a may be changed as appropriate.

The sealing portion 5 covers the upper surface and side surface of the first metal member 1, the lower surface and the side surface of the second metal member 2, the third metal member 3, and the semiconductor element 10 and seals the semiconductor element 10. The sealing portion 5 may further cover the upper surface of the second metal member 2. A portion of the first terminal 1a, the second terminal 2a, and the third terminal 3a may be not covered by the sealing portion 5 and be exposed to the outside.

Figure 4:
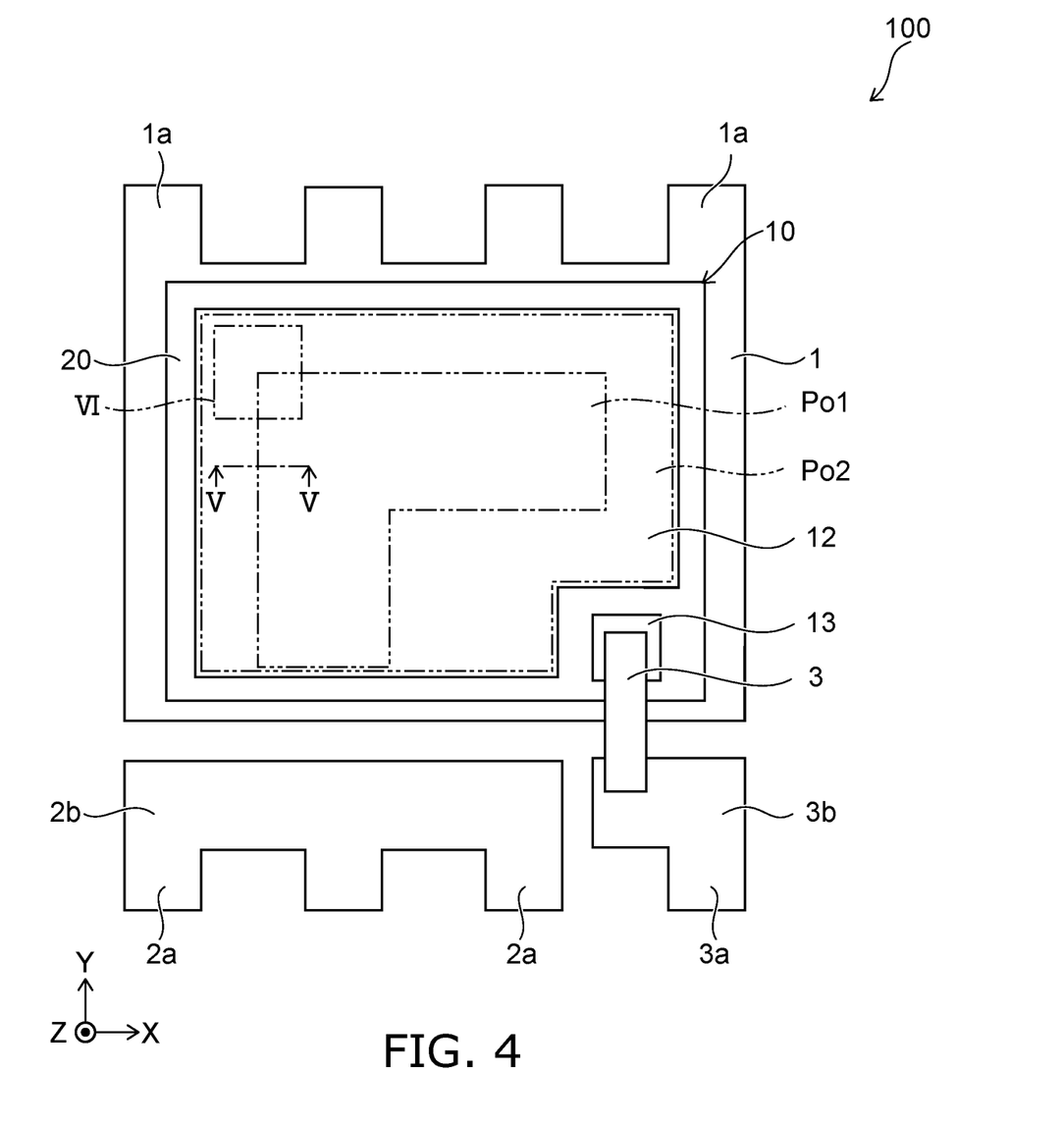
FIG. 4 is a plan view illustrating a semiconductor device according to the first embodiment.

FIG. 4 is a plan view illustrating a semiconductor device according to the first embodiment.

Figure 5:
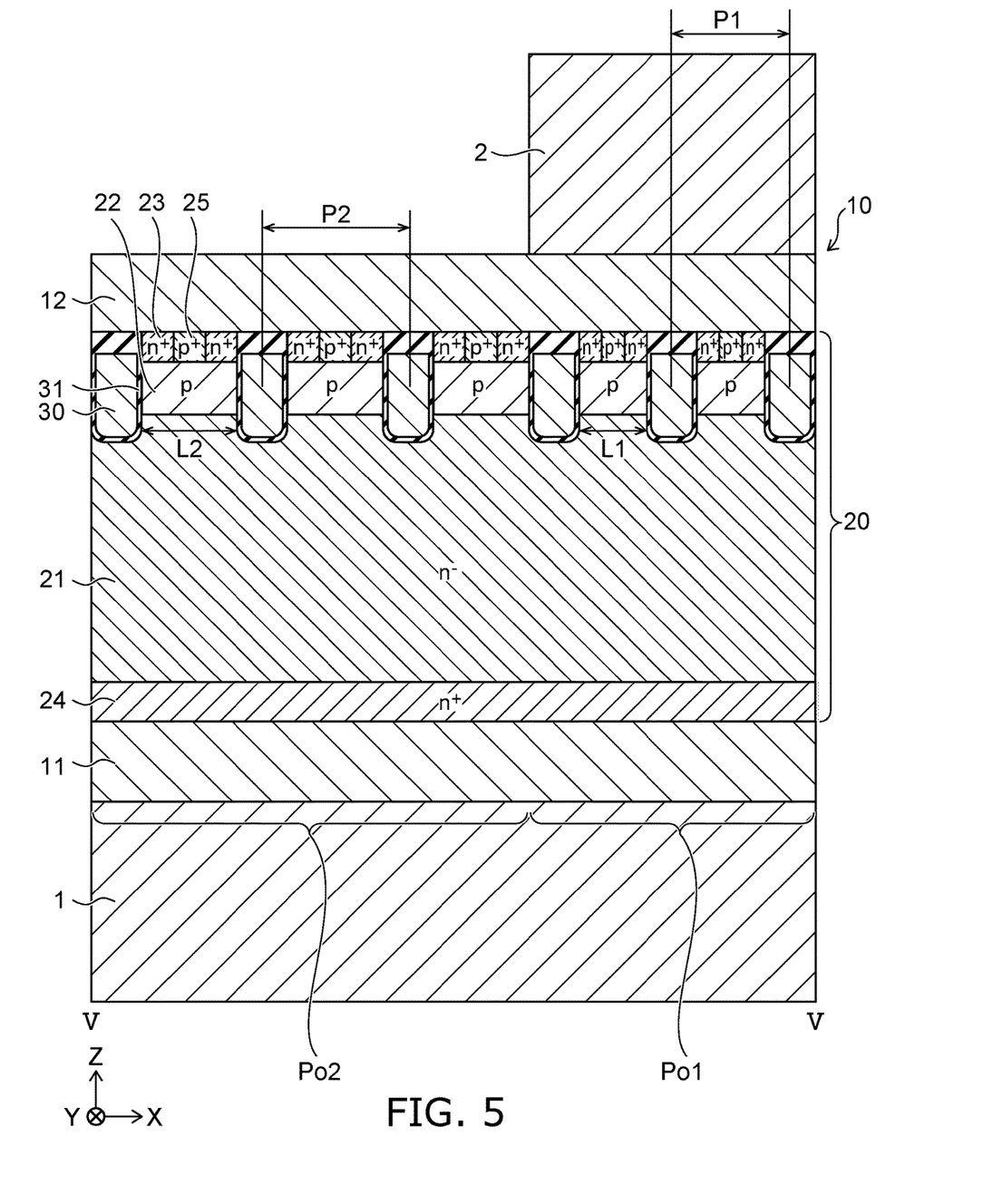
FIG. 5 is a cross-sectional view taken along V-V in FIG. 4.

FIG. 5 is a cross-sectional view taken along V-V in FIG. 4.

In FIG. 4, the second metal member 2 and the sealing portion 5 are omitted. As illustrated in FIG. 4, the semiconductor element 10 includes a first portion Po1 and a second portion Po2. The second electrode 12 is provided in the first portion Po1 and the second portion Po2. The first portion Po1 overlaps the second metal member 2 in the Z-direction. The first portion Po1 is in contact with the second metal member 2 via the join portion 52. The second portion Po2 does not overlap the second metal member 2 in the Z-direction. For example, the second portion Po2 is located around the first portion Po1 in the X-Y plane.

As illustrated in FIG. 5, the semiconductor layer 20 includes a $n^-$-type (first conductivity type) semiconductor region 21 (first semiconductor region), a p-type (second conductivity type) semiconductor region 22 (second semiconductor region), an $n^+$-type semiconductor region 23 (third semiconductor region), an $n^+$-type semiconductor region 24, a $p^+$-type semiconductor region 25, and a gate electrode 30.

The $n^+$-type semiconductor region 24 is provided on the first electrode 11 and electrically connected to the first electrode 11. The $n^-$-type semiconductor region 21 is provided on the $n^+$-type semiconductor region 24. The $n^-$-type semiconductor region 21 is electrically connected to the first electrode 11 via the $n^+$-type semiconductor region 24. The n-type impurity concentration in the $n^-$-type semiconductor region 21 is lower than the n-type impurity concentration in the $n^+$-type semiconductor region 24.

The p-type semiconductor region 22 is provided on the $n^-$-type semiconductor region 21. The $n^+$-type semiconductor region 23 and the $n^+$-type semiconductor region 25 are provided on the p-type semiconductor region 22. The p-type impurity concentration in the $p^+$-type semiconductor region 25 is higher than the p-type impurity concentration in the p-type semiconductor region 22.

The gate electrode 30 faces a portion of the $n^-$-type semiconductor region 21, the p-type semiconductor region 22, and the $n^+$-type semiconductor region 23 via a gate insulating layer 31 in the X-direction. The gate electrode 30 is electrically connected to the third electrode 13.

A plurality of the p-type semiconductor regions 22, a plurality of the $n^+$-type semiconductor regions 23, a plurality of the $n^+$-type semiconductor regions 24, a plurality of the $p^+$-type semiconductor regions 25, and a plurality of the gate electrodes 30 are provided in the X-direction. In each of the first portion Po1 and the second portion Po2, a plurality of the p-type semiconductor regions 22, a plurality of the $n^+$-type semiconductor regions 23, a plurality of the $n^+$-type semiconductor regions 24, a plurality of the $p^+$-type semiconductor regions 25, and a plurality of the gate electrodes 30 are provided. Each p-type semiconductor region 22, each $n^+$-type semiconductor region 23, each $n^+$-type semiconductor region 24, each $p^+$-type semiconductor region 25, and each gate electrodes 30 extend in the Y-direction.

The second electrode 12 is electrically connected to the plurality of p-type semiconductor regions 22 and the plurality of $n^+$-type semiconductor regions 23 in the first portion Po1 and the second portion Po2.

A length L1 illustrated in FIG. 5 is the length in the X-direction of the $n^-$-type semiconductor region 21 between a pair of gate electrodes 30 adjacent in the X-direction in the first portion Po1. A length L2 is the length in the X-direction of the $n^-$-type semiconductor region 21 between a pair of gate electrodes 30 adjacent in the X-direction in the second portion Po2. The length L2 is greater than the length L1. For example, a pitch P2 in the X-direction of the plurality of gate electrodes 30 in the second portion Po2 is greater than a pitch P1 in the X-direction of the plurality of gate electrodes 30 in the first portion Po1. The pitch corresponds to the distance between a pair of center points in the X-direction of adjacent gate electrodes 30.

Figure 6:
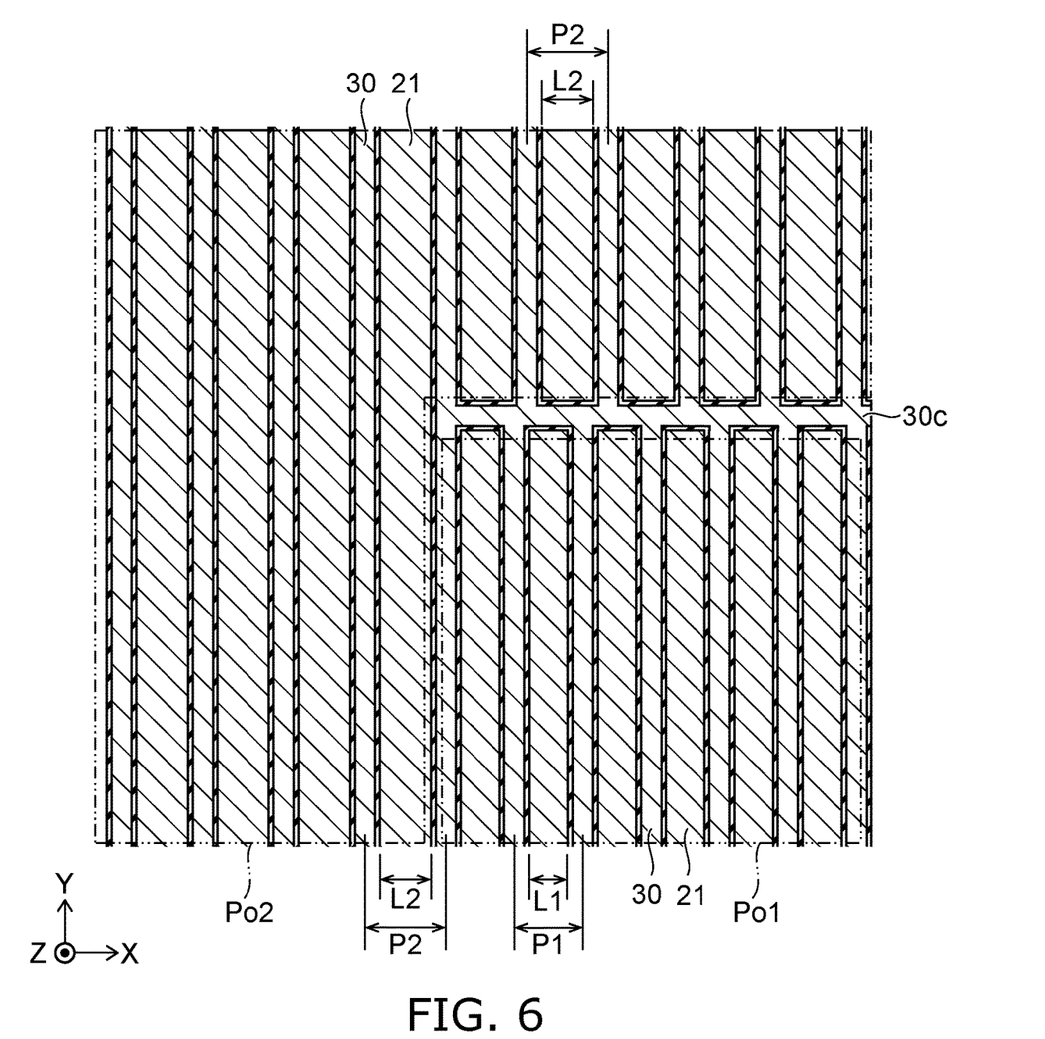
FIG. 6 is a plan view illustrating portion VI of FIG. 4.

FIG. 6 is a plan view illustrating portion VI of FIG. 4.

In FIG. 6, the second metal member 2, the sealing portion 5, the second electrode 12, the p-type semiconductor region 22, the $n^+$-type semiconductor region 23, and the $p^+$-type semiconductor region 25 are omitted.

The gate electrodes 30 provided in the second portion Po2 are electrically connected to the third electrode 13 via a not-illustrated gate wiring provided at the outer periphery of the semiconductor element 10. For example, as illustrated in FIG. 6, in the semiconductor layer 20, a connection portion 30c that extends in the X-direction is provided. The gate electrodes 30 provided in the first portion Po1 are electrically connected to the gate electrodes 30 provided in the second portion Po2 via the connection portion 30c.

The operation of the semiconductor device 100 will now be described.

When a voltage that is positive with respect to the second electrode 12 is applied to the first electrode 11, a voltage that is equal to or greater than a threshold is applied to the gate electrode 30 via the third electrode 13. Accordingly, a channel (inversion layer) is formed in the p-type semiconductor region 22, and the semiconductor element 10 is put in the on state. Electrons flow from the second electrode 12 to the first electrode 11 through the channel. In other words, current flows from the first electrode 11 to the second electrode 12. Thereafter, when the voltage applied to the gate electrode 30 is less than the threshold, the channel in the p-type semiconductor region 22 disappears, and the semiconductor element 10 is put in the off state.

Examples of the materials of the constituent elements of the semiconductor device 100 will now be described.

The first metal member 1, the second metal member 2, the third metal member 3, the first terminal 1a, the second terminal 2a, and the third terminal 3a include a metal such as copper. The first electrode 11, the second electrode 12, and the third electrode 13 include a metal such as aluminum. The $n^-$-type semiconductor region 21, the p-type semiconductor region 22, the $n^+$-type semiconductor region 23, $n^+$-type semiconductor region 24, and the $p^+$-type semiconductor region 25 include as a semiconductor material silicon, silicon carbide, gallium nitride, or gallium arsenide. In a case where silicon is used as the semiconductor material, arsenic, phosphorus, or antimony can be used as the n-type impurity. Boron can be used as the p-type impurity. The gate electrode 30 includes a conductive material such as polysilicon. Impurities may be added to the conductive material. The gate insulating layer 31 includes an insulating material such as silicon oxide. The join portions 51 to 55 include a metal, such as tin, antimony, silver, or copper.

The effects of an embodiment will now be described.

When the semiconductor element 10 is put in the on state, current flows in the semiconductor layer 20. When current flows in the semiconductor layer 20, heat is generated. The heat generated by the semiconductor layer 20 is mainly transferred to the first metal member 1 and the second metal member 2 via the first electrode 11 and the second electrode 12 and is discharged from the semiconductor device 100.

As illustrated in FIG. 4, the semiconductor element 10 includes the first portion Po1 and the second portion Po2. The first portion Po1 overlaps the second metal member 2 in the Z-direction. Thus, the heat generated in the first portion Po1 tends to be discharged to the second metal member 2. The second portion Po2 does not overlap the second metal member 2 in the Z-direction. Thus, the heat generated in the second portion Po2 is not as easily discharged to the second metal member 2 compared to the heat generated in the first portion Po1. When the semiconductor element 10 is active, the temperature of the second portion Po2 increases above the temperature of the first portion Po1.

When the semiconductor element 10 is in the on state and current is excessively concentrated in one or more channels, the semiconductor element 10 may fail. When the temperature of the second portion Po2 is greater than the temperature of the first portion Po1, the electrical resistance of the semiconductor region in the second portion Po2 is less than the electrical resistance of the semiconductor region in the first portion Po1. This difference in electrical resistance causes the current density flowing through the second portion Po2 to be greater than the current density flowing through the first portion Po1. In particular, as seen from the Z-direction, the area of the second portion Po2 is less than the area of the first portion Po1. Thus, the current flow tends to be concentrated in the second portion Po2. The current concentration in the second portion Po2 causes the temperature of the second portion Po2 to increase, which may cause the semiconductor element 10 to fail.

As illustrated in FIG. 5, in the semiconductor device 100 according to this embodiment, the length L2 of the $n^-$-type semiconductor region 21 between the gate electrodes 30 in the second portion Po2 is greater than the length L1 of the $n^-$-type semiconductor region 21 between the gate electrodes 30 in the first portion Po1. For example, the pitch P2 of the gate electrodes 30 in the second portion Po2 is greater than the pitch P1 of the gate electrodes 30 in the first portion Po1. Thus, the number of gate electrodes 30 per unit area in the second portion Po2 is less than the number of gate electrodes 30 per unit area in the first portion Po1.

Accordingly, when the semiconductor element 10 is in the on state, the electrical resistance per unit area in the second portion Po2 is higher than the electrical resistance per unit area in the first portion Po1. An increase in the electrical resistance of the second portion Po2 makes the current less likely to concentrate in the second portion Po2 when the semiconductor element 10 is in the on state. For example, the current may be divided between the first portion Po1 and the second portion Po2. Alternatively, the current may flow mainly in the first portion Po1. According to this embodiment, by concentrating the current in the second portion Po2, the likelihood of the semiconductor element 10 failing can be reduced. The safe operating area (SOA) of the semiconductor element 10 can be enhanced.

In particular, the area of the first portion Po1 in the X-Y plane is greater than the area of the second portion Po2 in the X-Y plane. Accordingly, even in a case where the current mainly flows in the first portion Po1, current concentration can be suppressed more than in a case where the current flows mainly in the second portion Po2.

Here, two reference examples will be given as semiconductor device capable of suppressing current concentration in the second portion Po2. In the semiconductor device according to the first reference example, in the second portion Po2, the $n^+$-type semiconductor region 23 and the gate electrode 30 are not provided. In the semiconductor device according to the second reference example, in both the first portion Po1 and the second portion Po2, the plurality of gate electrodes 30 are provided at the same pitch, and in the second portion Po2, one or more gate electrodes 30 are electrically connected to the second electrode 12.

In the semiconductor device according to the first reference example, when the semiconductor element 10 is in the on state, a current does not flow in the second portion Po2. Thus, the on-resistance of the semiconductor element 10 is increased. According to the first embodiment, the likelihood of the semiconductor element 10 failing can be suppressed, and the on-resistance of the semiconductor device can be reduced compared to the first reference example.

According to the semiconductor device according to the second reference example, because a current flows in the second portion Po2, the on-resistance of the semiconductor element 10 can be reduced compared to the first reference example. However, by providing the gate electrode 30 electrically connected to the second electrode 12, the width (length in the X-direction) of the n⁻-type semiconductor region 21 between adjacent gate electrodes 30 is less than in the first embodiment. Because the width of the n⁻-type semiconductor region 21 is less, the width of the current path is decreased. Thus, the on-resistance of the semiconductor device is increased. According to the first embodiment, the length L2 of the n⁻-type semiconductor region 21 in the second portion Po2 is greater than the length L1 of the n⁻-type semiconductor region 21 in the first portion Po1. Because the length L2 is greater than the length L1, the width of the current path between adjacent gate electrodes 30 is increased. Thus, according to the first embodiment, the likelihood of the semiconductor element 10 failing can be suppressed, and the on-resistance of the semiconductor device can be reduced compared to the second reference example.

Figure 7:
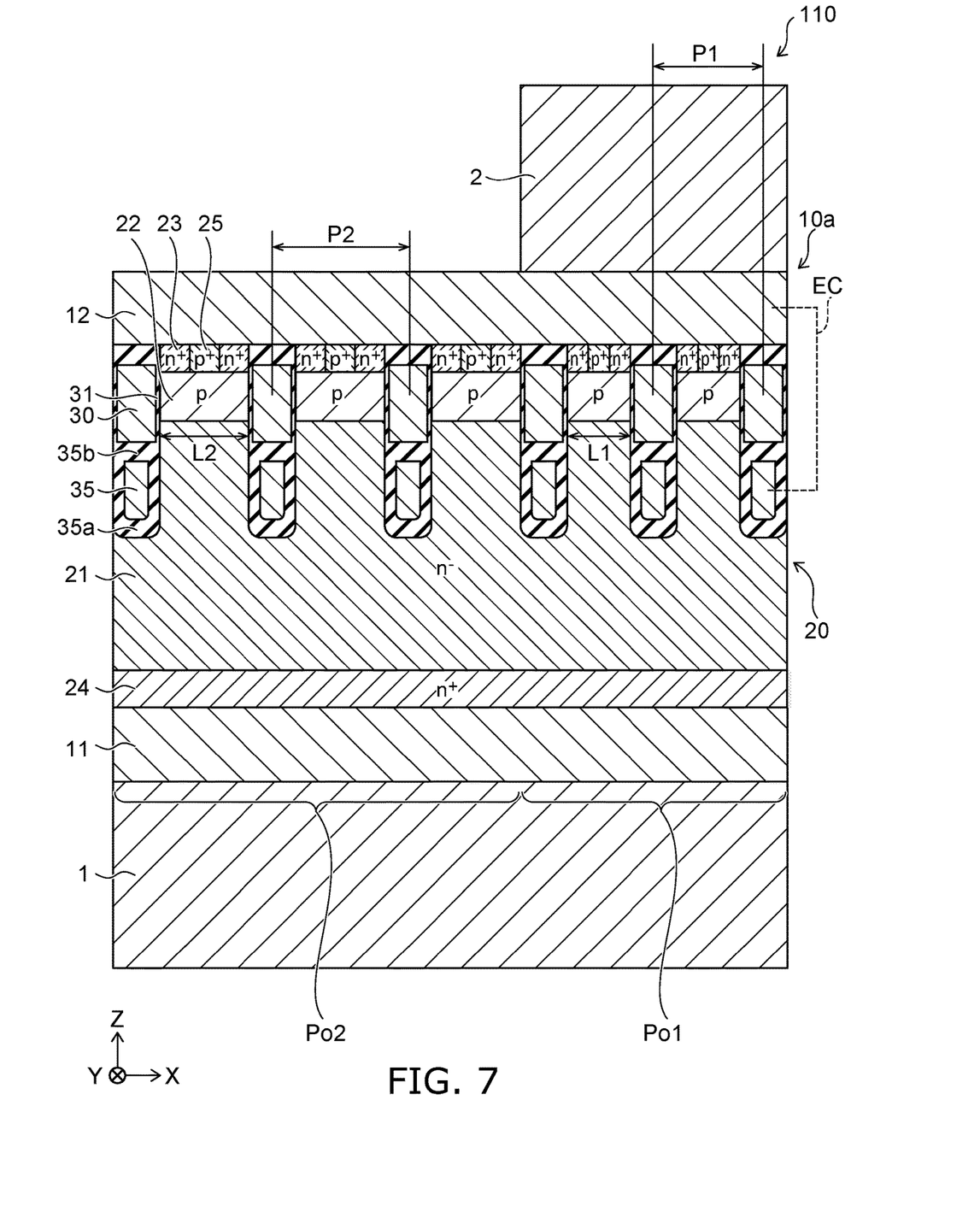
FIG. 7 is a cross-sectional view illustrating a portion of a semiconductor device according to a modification of the embodiment.
Figure 8:
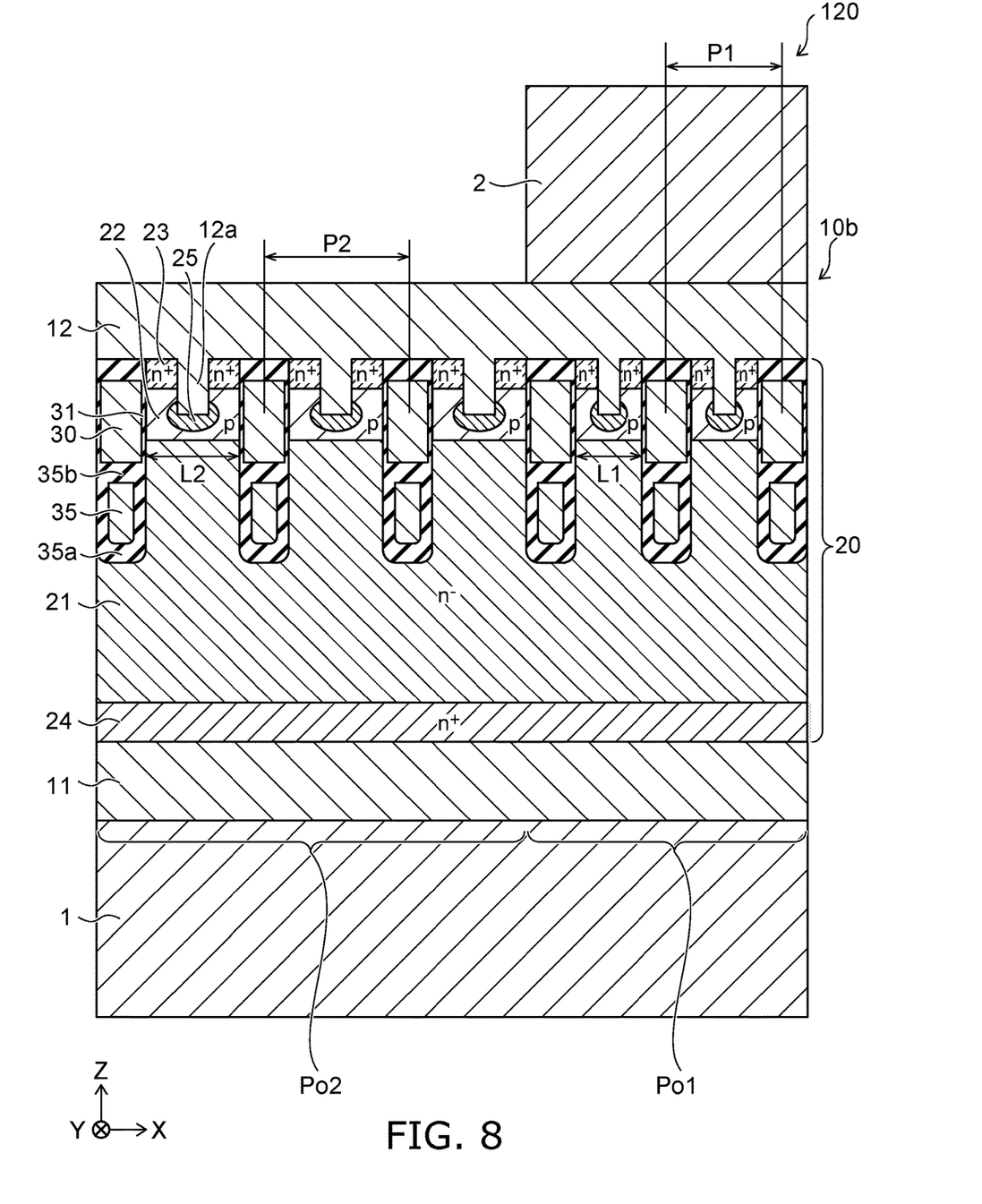
FIG. 8 is a cross-sectional view illustrating a portion of a semiconductor device according to a modification of the embodiment.
Figure 9:
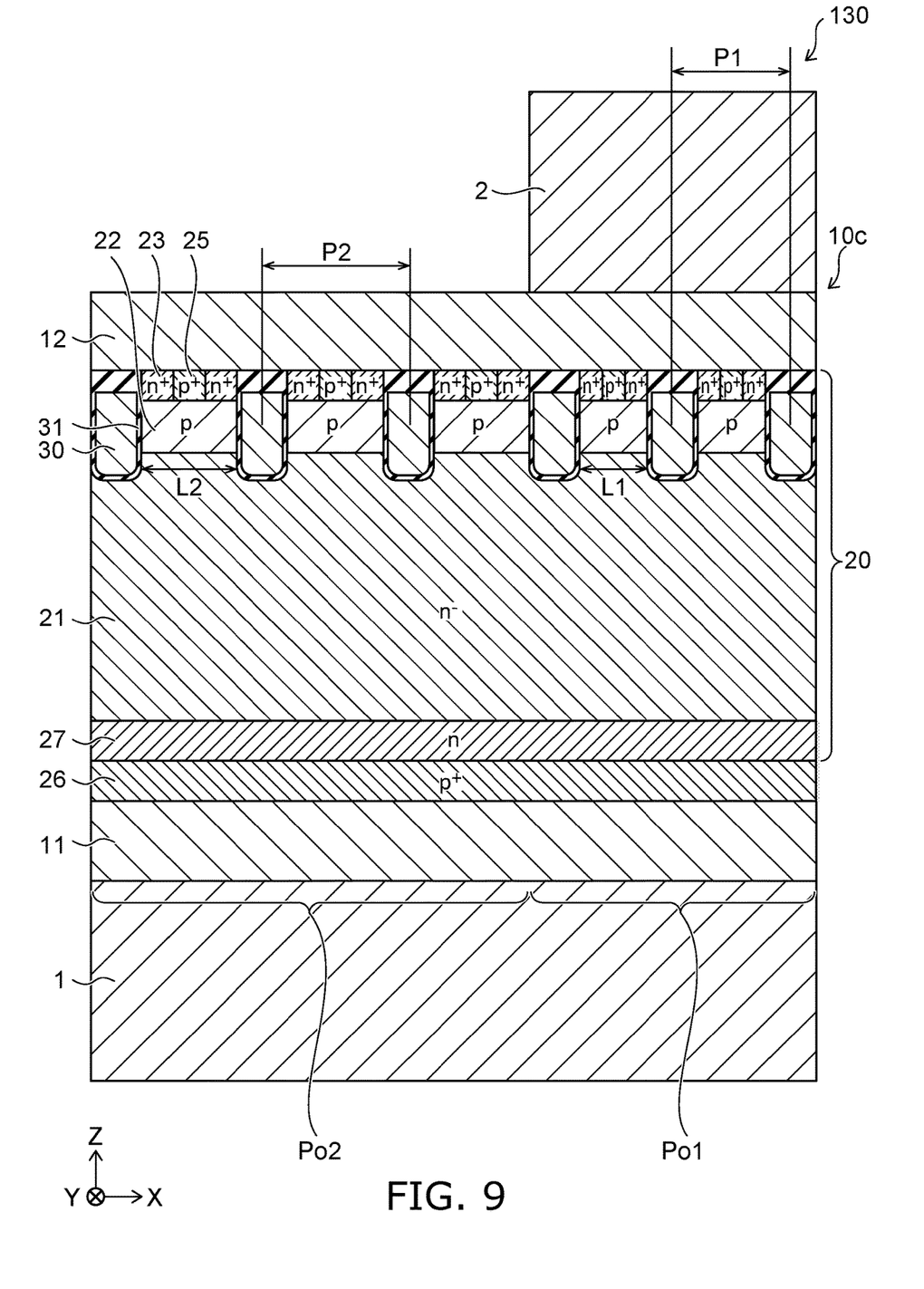
FIG. 9 is a cross-sectional view illustrating a portion of a semiconductor device according to a modification of the embodiment.

FIGS. 7 to 9 are cross-sectional views illustrating a portion of semiconductor devices according to modifications of the embodiment.

As illustrated in FIG. 7, in a semiconductor device 110, the semiconductor layer 20 includes a conductive portion 35. The conductive portion 35 is provided in the n⁻-type semiconductor region 21 via an insulating layer 35a. The gate electrode 30 is provided on the conductive portion 35 via an insulating layer 35b.

Between the second electrode 12 and the conductive portion 35, an electrical connection EC is provided. The electric potential of the conductive portion 35 is the same as the electric potential of the second electrode 12. A plurality of the conductive portions 35 are provided in the X-direction. Each conductive portion 35 extends in the Y-direction. For, the end portions of the conductive portions 35 in the Y-direction extend upward and are in contact with the second electrode 12.

Also, the conductive portion 35 may be electrically connected to the gate electrode 30, and the electric potential of the conductive portion 35 may be the same as the electric potential of the gate electrode 30. In this case, the insulating layer 35b is not provided, and the conductive portion 35 is in contact with the gate electrode 30.

When the semiconductor device 110 is switched to the off state, a voltage that is positive with respect to the second electrode 12 applied to the first electrode 11 increases. This increase in positive voltage causes a depletion layer to expand from the interface between the n⁻-type semiconductor region 21 and the p-type semiconductor region 22. Also, a depletion layer expands from the interface between the n⁻-type semiconductor region 21 and the insulating layer 35a toward the n⁻-type semiconductor region 21. The breakdown voltage of the semiconductor device 110 can be increased by the depletion layer expanding in the manner of the latter. Also, the breakdown voltage of the semiconductor device 110 can be maintained, the n-type impurity concentration in the n⁻-type semiconductor region 21 can be increased, and the on-resistance of the semiconductor device 110 can be reduced.

The length L2 is greater than the length L_1. Thus, a depletion region is less likely to form in the n⁻-type semiconductor region 21 between adjacent conductive portions 35 in the second portion Po2 than in the n⁻-type semiconductor region 21 between adjacent conductive portions 35 in the first portion Po1. To promote depletion in the n⁻-type semiconductor region 21 in the second portion Po2, the n-type impurity concentration of the n⁻-type semiconductor region 21 in the second portion Po2 may be less than the n-type impurity concentration of the n⁻-type semiconductor region 21 in the first portion Po1.

Also, as described above, by providing the conductive portion 35, the breakdown voltage of the semiconductor device 110 can be maintained, and the n-type impurity concentration in the n⁻-type semiconductor region 21 can be increased. In this manner, the on-resistance of a semiconductor element 10a can be reduced. By reducing the on-resistance of the semiconductor element 10a, the amount of heat generated is reduced. Thus, the current flowing to the semiconductor device 110 can be increased. With the current is increased, when a temperature difference between the first portion Po1 and the second portion Po2 occurs, the current further tends to concentrate in the second portion Po2. According to this embodiment, even when the conductive portion 35 is provided, current concentration in the second portion Po2 can be effectively suppressed, and the likelihood of the semiconductor element 10a failing can be reduced.

In a semiconductor device 120 illustrated in FIG. 8, in contrast to the semiconductor device 110, the second electrode 12 includes a contact portion 12a. The contact portion 12a protrudes toward the p-type semiconductor region 22. For example, a pair of n⁺-type semiconductor regions 23 are provided on one p-type semiconductor region 22. The contact portion 12a is located between the pair of n⁺-type semiconductor region 23 in the X-direction. The p⁺-type semiconductor region 25 is provided between the p-type semiconductor region 22 and the bottom portion of the contact portion 12a.

According to the semiconductor device 120, the contact area between the second electrode 12 and the p⁺-type semiconductor region 25 is increased. In this manner, the electric potential of the p-type semiconductor region 22 can be further stabilized. For example, when an avalanche breakdown occurs in the n⁻-type semiconductor region 21, a fluctuation in the electric potential of the p-type semiconductor region 22 can be suppressed. Parasitic transistor effects can be suppressed, and the likelihood of a semiconductor element 10b failing can be further reduced.

A semiconductor device 130 illustrated in FIG. 9 includes a p⁺-type semiconductor region 26 and a n-type semiconductor region 27 instead of the n⁺-type semiconductor region 24. The p⁺-type semiconductor region 26 is provided between the first electrode 11 and the n⁻-type semiconductor region 21 and is electrically connected to the first electrode 11. The n-type semiconductor region 27 is provided between the p⁺-type semiconductor region 26 and the n⁻-type semiconductor region 21. The n-type impurity concentration in the n-type semiconductor region 27 is higher than the n-type impurity concentration in the n⁻-type semiconductor region 21.

The operation of the semiconductor device 130 will now be described.

In the semiconductor device 130, a semiconductor element 10c is an IGBT. When a voltage that is positive with respect to the second electrode 12 is applied to the first electrode 11, a voltage that is equal to or greater than a threshold is applied to the gate electrode 30. Accordingly, a channel (inversion layer) is formed in the p-type semiconductor region 22. Electrons are injected from the second electrode 12 to the n⁻-type semiconductor region 21 via the channel. Holes are injected from the p⁺-type semiconductor region 25 to the n⁻-type semiconductor region 21. This puts the semiconductor device 130 in the on state. In the n⁻-type semiconductor region 21, the injected electrons and holes cause conductivity modulation, which reduces the electrical resistance of the n⁻-type semiconductor region 21.

In a similar manner to that of the semiconductor device 100, according to the semiconductor devices 110 to 130 according to the modifications, the length L2 of the n⁻-type semiconductor region 21 in the second portion Po2 is greater than the length L1 of the n⁻-type semiconductor region 21 in the first portion Po1. The pitch P2 of the gate electrodes 30 in the second portion Po2 is greater than the pitch P1 of the gate electrodes 30 in the first portion Po1. Thus, the likelihood of the semiconductor elements 10a to 10c failing due to current concentration can be reduced.

Second Embodiment

Figure 10:
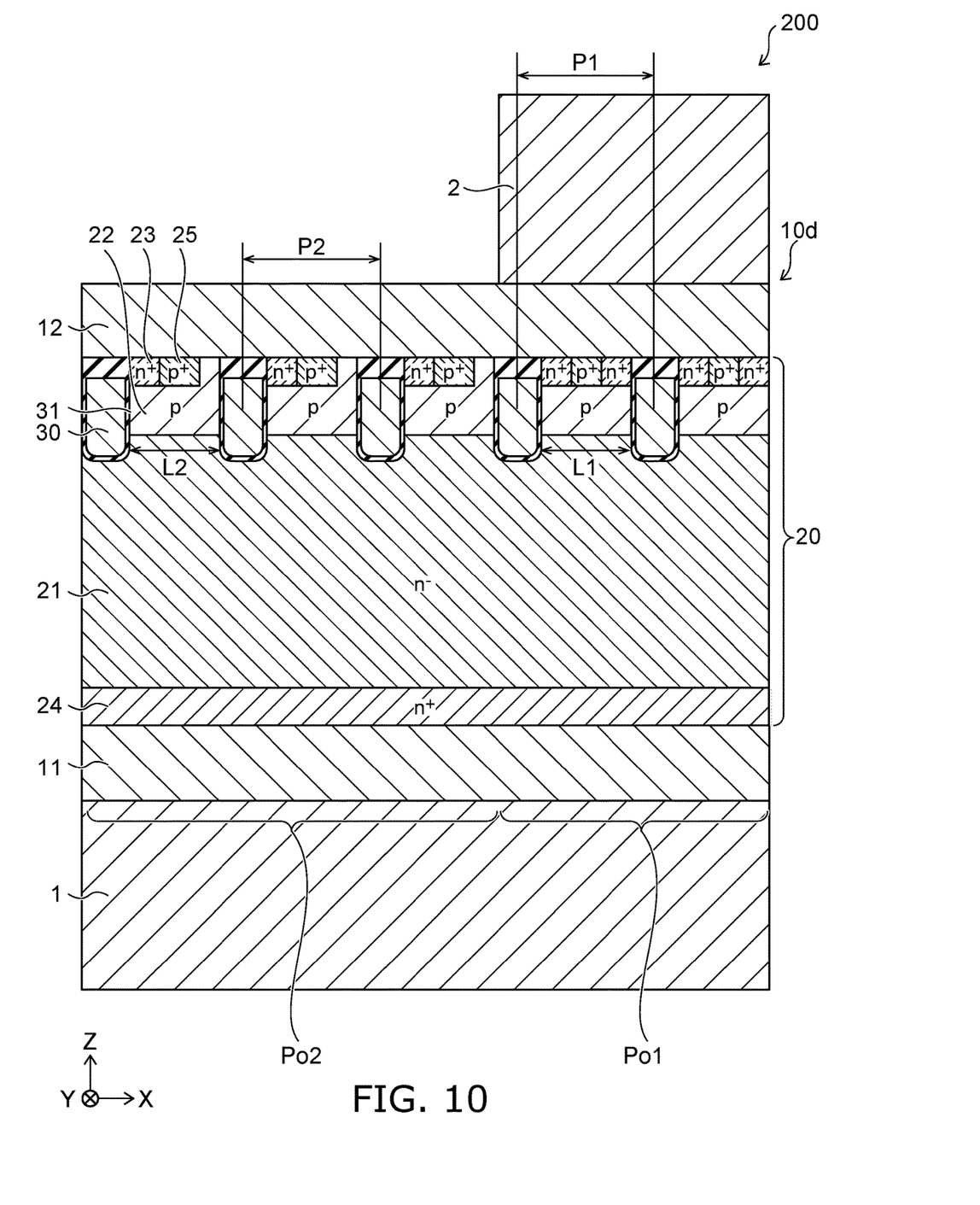
FIG. 10 is a cross-sectional view illustrating a portion of a semiconductor device according to a second embodiment.

FIG. 10 is a cross-sectional view illustrating a portion of a semiconductor device according to the second embodiment.

A semiconductor device 200 according to the second embodiment is different from the semiconductor device 100 in that it includes a semiconductor element 10d instead of the semiconductor element 10a. The semiconductor element 10d is a MOSFET. In the semiconductor element 10d, the number of units per area of the n⁺-type semiconductor region 23 in the second portion Po2 is less than the number of units per area of the n⁺-type semiconductor region 23 in the first portion Po1.

As illustrated in FIG. 10 for example, in the first portion Po1, a pair of n⁺-type semiconductor regions 23 are provided on one p-type semiconductor region 22. In the second portion Po2, one n⁺-type semiconductor region 23 is provided on a part of one p-type semiconductor region 22. Another part of the one p-type semiconductor region 22 is arranged with the one n⁺-type semiconductor region 23 in the X-direction. The one n⁺-type semiconductor region 23 contacts one gate insulating layer 31. The other part of the one p-type semiconductor region 22 contacts another one gate insulating layer 31. In the region where no n⁺-type semiconductor region 23 is provided, even when voltage is applied to the gate electrode 30, current does not flow. When the number of n⁺-type semiconductor regions 23 is low, the current flowing when the semiconductor element 10d is in the on state is decreased. In other words, the electrical resistance is increased. According to the second embodiment, as in the first embodiment, the electrical resistance of the semiconductor region in the second portion Po2 is higher than the electrical resistance of the semiconductor region in the first portion Po1. Accordingly, when the semiconductor element 10d is in the on state, current concentration in the second portion Po2 can be suppressed. As a result, by concentrating the current in the second portion Po2, the likelihood of the semiconductor element 10d failing can be reduced.

For example, the length L2 of the n⁻-type semiconductor region 21 in the second portion Po2 is equal to the length L1 of the n⁻-type semiconductor region 21 in the first portion Po1. The pitch P2 of the gate electrodes 30 in the second portion Po2 is equal to the pitch P1 of the gate electrodes 30 in the first portion Po1.

Alternatively, as in the first embodiment, the length L2 may be greater than the length L1. The pitch P2 may also be greater than the pitch P1. Accordingly, current concentration in the second portion Po2 can be further suppressed.

As illustrated in FIG. 10, the width of the p⁺-type semiconductor region 25 provided in the second portion Po2 may be greater than the width of the p⁺-type semiconductor region 25 provided in the first portion Po1. In the second portion Po2, one side surface of the p⁺-type semiconductor region 25 may be in contact with the gate insulating layer 31. This further suppresses fluctuation in the electric potential of the p-type semiconductor region 22 in the second portion Po2.

The structure of the semiconductor device according to the modifications of the first embodiment may be applied to the semiconductor device 200 according to the second embodiment. For example, in the semiconductor device 200, the conductive portion 35 may be provided in the semiconductor layer 20. The second electrode 12 may include the contact portion 12a. The semiconductor element 10d may be a IGBT and may include the p⁺-type semiconductor region 26 and the n-type semiconductor region 27 instead of the n⁺-type semiconductor region 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
   a first metal member electrically connected to a first terminal;
   a semiconductor element including
      a first electrode provided on the first metal member and electrically connected to the first metal member,
      a first semiconductor region of a first conductivity type provided on the first electrode,
      a second semiconductor region of a second conductivity type provided on the first semiconductor region,
      a third semiconductor region of the first conductivity type provided on the second semiconductor region,
      a gate electrode facing a portion of the first semiconductor region, the second semiconductor region, and the third semiconductor region via a gate insulating layer in a second direction perpendicular to a first direction, the first direction being from the first metal member toward the first electrode, and
      a second electrode provided on the second semiconductor region and the third semiconductor region, and electrically connected to the second semiconductor region and the third semiconductor region; and
   a second metal member provided on the second electrode, the second metal member being electrically connected to the second electrode and electrically connected to a second terminal, a plurality of the second semiconductor regions, a plurality of the third semiconductor regions, and a plurality of the gate electrodes being provided in the second direction in the semiconductor element,
the semiconductor element including
  a first portion where the second electrode is provided, the first portion overlapping the second metal member in the first direction, and
  a second portion where the second electrode is provided, the second portion not overlapping the second metal member in the first direction,
a length in the second direction of the first semiconductor region between an adjacent pair of the gate electrodes in the second portion being greater than a length in the second direction of the first semiconductor region between an adjacent pair of the gate electrodes in the first portion.

2. The device according to claim 1, wherein
a pitch in the second direction of a plurality of the gate electrodes in the second portion is greater than a pitch in the second direction of a plurality of the gate electrodes in the first portion.

3. The device according to claim 1, wherein
a number of the gate electrodes per unit area in the second portion is less than a number of the gate electrodes per unit area in the first portion.

4. The device according to claim 1, wherein
a number of the third semiconductor regions per unit area in the second portion is less than a number of the third semiconductor regions per unit area in the first portion.

5. The device according to claim 4, wherein
one of the plurality of third semiconductor regions is provided on a part of one of the plurality of second semiconductor regions and contacts one of a plurality of the gate insulating layers, and
another part of the one of the plurality of second semiconductor regions is arranged with the one of the plurality of third semiconductor regions in the second direction and contacts another one of the plurality of gate insulating layers.

6. The device according to claim 4, wherein
the semiconductor element further includes a fourth semiconductor region of the second conductivity type,
the fourth semiconductor region is provided on the second semiconductor region and is adjacent with one of the plurality of third semiconductor regions,
the one of the plurality of third semiconductor regions contacts one of a plurality of the gate insulating layers, and
the fourth semiconductor region contacts another one of the plurality of gate insulating layers.

7. The device according to claim 1, further comprising:
a third metal member electrically connected to a third terminal,
the semiconductor element further including a third electrode,
the third electrode being separated from the second electrode and electrically connected to the plurality of gate electrodes,
the third metal member being provided on the third electrode and electrically connected to the third electrode.

8. A semiconductor device, comprising:
a first metal member electrically connected to a first terminal;
a semiconductor element including
  a first electrode provided on the first metal member and electrically connected to the first metal member,
  a first semiconductor region of a first conductivity type provided on the first electrode,
  a second semiconductor region of a second conductivity type provided on the first semiconductor region,
  a third semiconductor region of a first conductivity type provided on the second semiconductor region,
  a gate electrode facing a portion of the first semiconductor region, the second semiconductor region, and the third semiconductor region via a gate insulating layer in a second direction perpendicular to a first direction, the first direction being from the first metal member toward the first electrode, and
  a second electrode provided on the second semiconductor region and the third semiconductor region and electrically connected to the second semiconductor region and the third semiconductor region; and
a second metal member provided on the second electrode, the second metal member being electrically connected to the second electrode and electrically connected to a second terminal,
a plurality of the second semiconductor regions, a plurality of the third semiconductor regions, and a plurality of the gate electrodes being provided in the second direction in the semiconductor element
the semiconductor element including
  a first portion where the second electrode is provided, the first portion overlapping the second metal member in the first direction, and
  a second portion where the second electrode is provided, the second portion not overlapping the second metal member in the first direction,
a number of the third semiconductor regions per unit area in the second portion being less than a number of the third semiconductor regions per unit area in the first portion.

* * * * *